United States Patent [19]

Wilson et al.

[11] 4,397,003

[45] Aug. 2, 1983

[54] DYNAMIC RANDOM ACCESS MEMORY

[75] Inventors: Dennis R. Wilson, Boise, Id.; Robert J. Proebsting, Dallas, Tex.

[73] Assignee: Mostek Corporation, Carrollton, Tex.

[21] Appl. No.: 282,181

[22] PCT Filed: Jun. 2, 1980

[86] PCT No.: PCT/US80/00673

§ 371 Date: Jun. 2, 1980

§ 102(e) Date: Jun. 2, 1980

[87] PCT Pub. No.: WO81/03568

PCT Pub. Date: Dec. 10, 1981

[51] Int. Cl.³ .......................... G11C 7/00; G11C 7/06
[52] U.S. Cl. .................................... 365/205; 365/203; 365/208
[58] Field of Search ............... 365/149, 203, 205, 207, 365/208

[56] References Cited

U.S. PATENT DOCUMENTS 3,969,706 7/1976 Proebsting et al. ............. 340/173 R
4,061,999 12/1977 Proebsting et al. ................. 365/182
4,290,120 9/1981 Stein ..................................... 365/205
4,291,393 9/1981 Wilson ................................ 365/203

OTHER PUBLICATIONS

Foss, Richard C., and Harland, Robert, "Simplified Peripheral Circuits for a Marginally Testable 4k RAM", *IEEE International Solid-State Circuits Conference*, Feb. 1975, pp. 102–103.

Foss, Richard C., "The Design of MOS Dynamic RAMs", *IEEE International Solid-State Circuits Conference*, Feb. 1979, pp. 140–141.

*Primary Examiner*—Stuart N. Hecker

[57] ABSTRACT

A dynamic random access memory (10) receives a memory address of a row decoder (14) which charges a selected row line (18). When the row line (18) is charged an access transistor (24) in a memory cell (22) is rendered conductive to connect a storage capacitor (26) to a bit line (30). The bit lines (30, 38) are previously set at an equilibration voltage. The voltage on the bit line (30) is driven slightly above the equilibration voltage if a high voltage state had been stored in the capacitor (26) or the voltage on the bit line is driven slightly below the equilibration voltage if a low voltage state had been stored on the capacitor (26). A sense amplifier (44) is connected to the bit lines (30, 38) and upon receipt of a latch signal (L) drives the one of the bit lines (30, 38) having the lower voltage to a low voltage state. A pull-up circuit (60) drives the voltage on the remaining bit line of the pair to a high voltage state, restoring the memory storage capacitor (26) to its initial state. After the row line (18) is now discharged trapping the original data state in the storage capacitor (26), precharge transistors (50, 52) then connect together the bit lines (30, 38) through a latch node (46) to share charge between the bit lines (30, 38) and drive the bit lines (30, 38) to the equilibration voltage.

9 Claims, 4 Drawing Figures

4,397,003

DYNAMIC RANDOM ACCESS MEMORY

TECHNICAL FIELD

The present invention pertains to semiconductor integrated circuits and in particular to a random access memory which utilizes dynamic memory cells.

BACKGROUND ART

The operation of previous dynamic random access memory circuits is described in U.S. Pat. No. 3,588,844 and 3,514,765 to Christeneon, U.S. Pat. No. 3,699,537 to Wahlstrom and U.S. Pat. No. 3,902,082 and 3,969,706 to Proebsting et al. As shown in the Wahlstrom and Proebsting Patents, it has been the practice to use sense amplifiers to detect voltage differentials on bit lines which have had memory cells connected thereto. The connection of the memory cell to the bit line changes the previously established voltage on the bit line to estabish the desired data state as a voltage differential on the bit lines. However, the voltage change on a bit line caused by the connection of a memory cell thereto is very small and the detection of such a small voltage change has presented a serious problem in the design of dynamic random access memories. A further problem is that electrical noise can be picked up by the bit lines and this noise can mask the desired voltage offset produced by a memory cell. Further, integrated circuit fabrication tolerances can result in unbalanced bit lines which also interfere with the reading of a memory cell.

In response to these problems, it has heretofore been the practice to incorporate a dummy cell with each bit line of the memory. The dummy cells are precharged to a given voltage state and are connected during each memory cycle to the nonselected bit line within each pair of bit lines. However, the inclusion of a large number of dummy cells together with their associated circuitry increases the size of the integrated circuit and adds to the circuit complexity.

In view of the above problems, there exists a need for a dynamic random access memory which operates in such a method so as not to require a dummy cell for each bit line while at the same time providing reliable identification of the voltage states stored in the memory cells.

DISCLOSURE OF THE INVENTION

The present invention provides a method for operating a dynamic random access memory in the following steps. A high or low voltage state is stored in a dynamic memory cell where the high voltage state corresponds to a first data state and the low voltage state corresponds to a second data state. The memory cell is then connected to one of a pair of bit lines after the bit lines have been set to an intermediate voltage state. When a memory cell storing a low voltage is connected to the bit line, the voltage on the bit line is decreased. When a memory cell storing a high voltage is connected to the bit line, the voltage on the bit line is increased. When the voltage state on one bit line is being changed by the connection of a memory cell thereto, the complementary bit line of the pair of bit lines is maintained essentially at the intermediate voltage state which had been set thereon. After the memory cell has been connected to one of the bit lines, the bit line having the lowest voltage thereon is driven to a low voltage state, and the other of the bit lines is driven to a high voltage state. The memory cell is disconnected from the corresponding bit line after the corresponding bit line has been driven to either the low voltage state or the high voltage state. After the memory cell has been disconnected from the corresponding bit line, the bits lines are connected together to equilibrate the voltages on the bit lines to establish the intermediate voltage state in preparation for a new cycle.

BRIEF DESCRIPTION OF THE DRAWINGS

For a more complete understanding of the present invention and the advantages thereof, reference is now made to the following description taken in conjunction with the accompanying drawings in which:

FIG. 3 is a schematic illustration of the sense amplifier shown in FIG. 1; and

FIG. 4 is a schematic illustration of the pull-up circuit shown in FIG. 1.

DETAILED DESCRIPTION OF THE INVENTION

Figure 1:
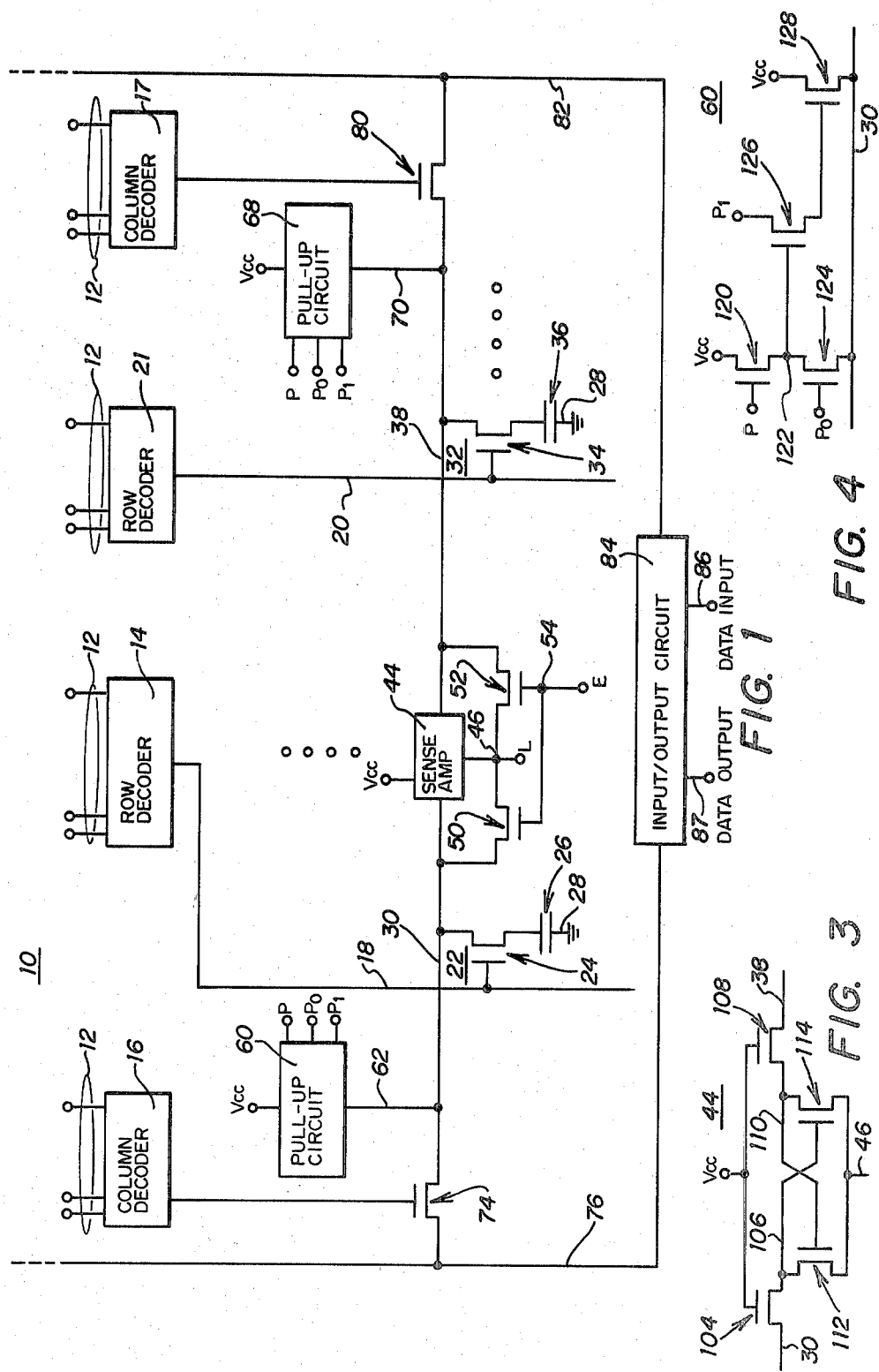
FIG. 1 is a schematic illustration of the dynamic random access memory in accordance with the present invention.

The dynamic random access memory of the present invention is illustrated in FIG. 1. A memory address is provided to the memory 10 through a group of address lines 12. The address lines 12 are provided to each of a plurality of row decoders such as row decoder 14. The address lines 12 are also connected to each of a plurality of column decoders such as decoders 16 and 17. The address bits for the selected row line are provided in parallel fashion through lines 12 at one time in the memory cycle and the address bits for the selected column are provided through lines 12 at a later time in the memory cycle. This is illustrated by the address waveform indicated as $A_0$-$A_n$ shown in FIG. 2.

The row address bits select a row decoder such as 14 which in turn activates a row line 18. The row line 18 is connected to a dynamic memory cell 22 which comprises an access transistor 24 and a storage capacitor 26. The gate terminal of transistor 24 is connected to the row line 18 and the source terminal of the access transistor is connected to a first terminal of capacitor 26. The remaining terminal of capacitor 26 is connected to a ground node 28. The drain terminal of access transistor 24 is connected to a bit line 30.

A row line 20 is charged by a row decoder 21 and is connected to a dynamic memory cell 32 which comprises an access transistor 34 and a storage capacitor 36. The gate terminal of transistor 34 is connected to the row line 20 and the source terminal thereof is connected to a first terminal of the capacitor 36. The remaining terminal of capacitor 36 is connected to the ground node 28. The drain terminal of transistor 34 is connected to a bit line 38.

Figure 2:
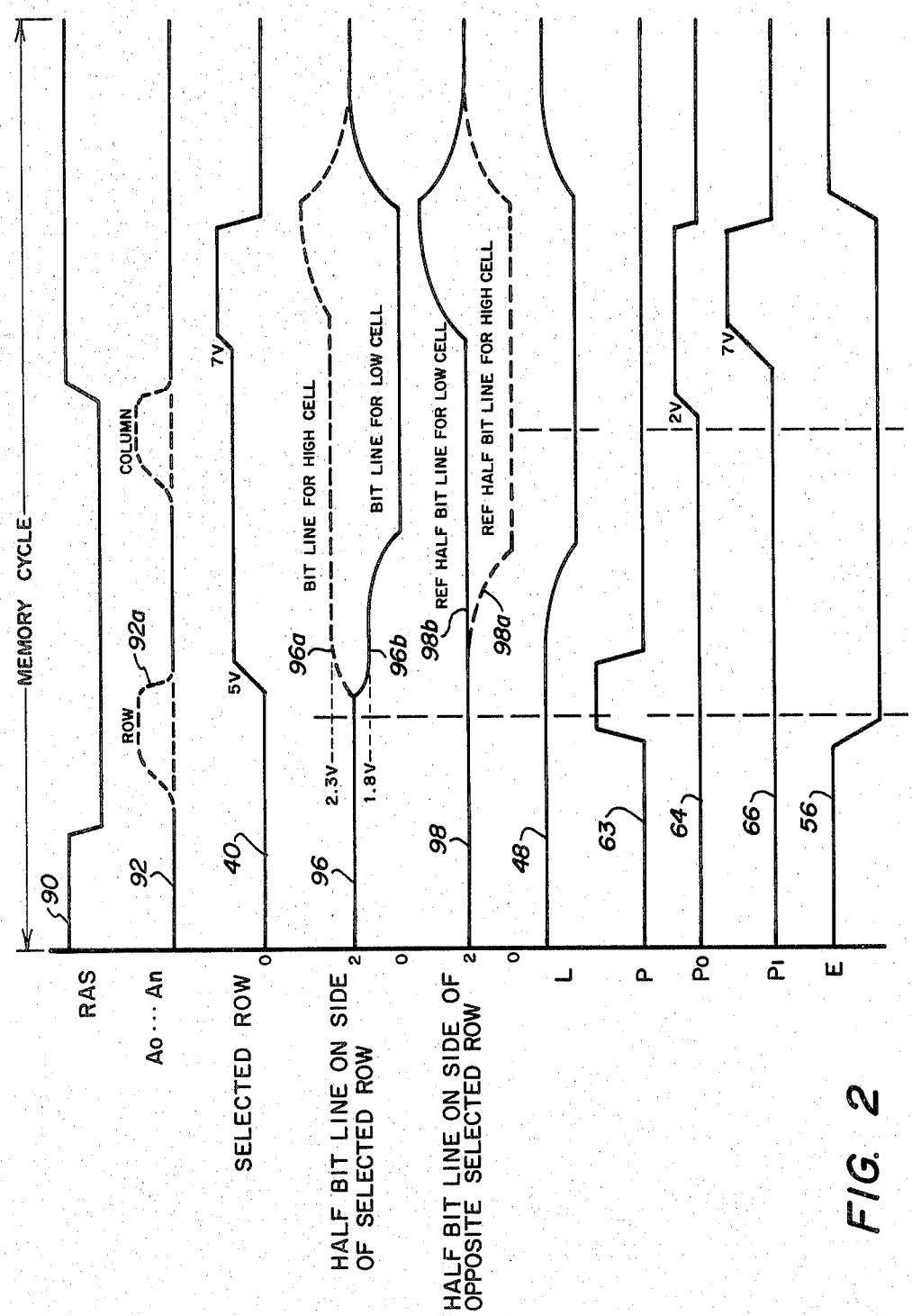
FIG. 2 is a set of timing diagrams illustrating the various signals which occur in the dynamic random access memory illustrated in FIG. 1.

When row line 18 is driven to a high voltage state the corresponding access transistor 24 is activated to provide a conductive path between the bit line 30 and the storage capacitor 26. The voltage on a row line selected by a row decoder is illustrated by the timing signal 40 shown in FIG. 2. The sense amplifier 44 is activated in response to a latch signal which is transmitted through a latch node 46. The latch signal L is illustrated in FIG. 2 as waveform 48.

The memory 10 includes an equilibration circuit which comprises transistors 50 and 52 wherein transistor 50 has the source and drain terminals thereof connected between bit line 30 and latch node 46 and transistor 52 has the source and drain terminals thereof connected between bit line 38 and the latch node 46. The gate terminals of transistors 50 and 52 are connected to a node 54 which receive a equilibration signal E. The equilibration signal E is illustrated in FIG. 2 as waveform 56. When the equilibration signal E is at high voltage state the transistors 50 and 52 are turned on thereby connecting the bit lines 30 and 38 to node 46.

A pull-up circuit 60 is connected to the bit line 30 through a line 62. The pull-up circuit 60 operates in response to precharge signals P, $P_0$ and $P_1$ which are illustrated respectively as waveforms 63, 64 and 66 in FIG. 2. A similar pull-up circuit 68 is connected to bit line 38 through line 70. Pull-up circuits 60 and 68 detect when the voltage on the corresponding bit line is above a preset voltage level and, upon receipt of the precharge signals, pulls the bit line up to the supply voltage, as described below.

Each of the bit lines is provided with a column transistor for routing data states into and out of the memory cells. Column transistor 74 has the source and drain terminals thereof connected between bit line 30 and an input/output line 76. The gate terminal of column transistor 74 is connected to the column decoder 16. Likewise, a column transistor 80 has the drain and source terminals thereof connected between bit line 38 and an input/output line 82. The gate terminal of column transistor 80 is connected to the column decoder 17 which responds to the same column address as does column decoder 16. The column decoders 16 and 17 activate selected column transistors in response to the column address bits received through address lines 12 to transfer data states to and from an addressed memory cell.

The input/output lines 76 and 82 are connected to an input/output circuit 84 which serves to transfer the data states which are written into and read from the memory cells. The data states are received from external circuitry through a data input terminal 86 and transmitted to external circuitry through a data output terminal 87.

The operation of the dynamic random access memory 10 of the present invention is now described in reference to FIGS. 1–4. It is assumed that this circuit operates with a 5.0 volt power supply. A memory cycle is initiated by a row address strobe (RAS) signal 90 which goes to an active state in a transition from a high level to a low level. The row address bits are supplied to the row decoder 14 as indicated by the reference numeral 92a. The row address bits are received shortly after the RAS signal goes to the active state. The row decoder 14 routes the row enable signal 40 to the selected row line.

When the row enable signal 40 goes to the five volt level the access transistor 24 in memory cell 22 is rendered conductive to connect the storage capacitor 26 to the bit line 30. The bit lines 30 and 38 have previously been equilibrated to the voltage level of approximately 2.0 volts as shown by waveform 96. If capacitor 26 has previously had a 5.0 volt level stored therein, bit line 30 would be driven to approximately 2.3 volts as indicated by waveform 96a in FIG. 2, due to charge sharing between the capacitor 26 and bit line 30. But if the capacitor 26 has previously been discharged to ground the bit line 30 will be pulled to approximately 1.8 volts as indicated by waveform 96b.

After the memory cell 22 has been connected to the bit line 30 the latch signal L shown as waveform 48 is pulled to ground potential. The sense amplifier 44 responds to the latch signal by pulling to ground potential the one of the bit lines connected thereto which is at the lower voltage. If capacitor 26 has previously been discharged the voltage on bit line 30 will be that shown in waveform 96b where the voltage is pulled to ground potential. But if the storage capacitor 26 has had a high voltage level stored therein, as shown in waveform 96a, bit line 30 will not be affected by the operation of sense amplifier 44. But if bit line 30 has been elevated in voltage shown by waveform 96a, it exceeds the bit line 38 voltage, shown as waveform 98, so that bit line 38 will be pulled to ground as shown by waveform 98a. But if the voltage on bit line 30 had been pulled down by the storage capacitor 26 the equilibration voltage on bit line 38 would not be affected by the sense amplifier 44. This condition is indicated in waveform 98b.

After the sense amplifier 44 has pulled one of the bit lines to ground and after the precharge signal P has precharged the pullup circuits 60 and 68, the precharge signals, $P_0$ and $P_1$ are received to activate the pull up circuits 60 and 68. The pull up circuits detect which one of the bit lines has a voltage thereon above a preset voltage. One of the bit lines will be at ground potential and the other of the bit lines will be at either the equilibration voltage or at the elevated voltage caused by connecting a storage capacitor having a high voltage stored therein. The bit line with the high voltage thereon will be pulled up to the supply voltage. For the bit lines which received a high charge from the storage cell this is indicated by waveform 96a and for the bit line which was at the equilibration voltage this is indicated by waveform 98b. At this time the storage capacitor which had been connected to the bit line has been restored to its original voltage.

When one of the bit lines has been driven to the supply voltage and the other bit line has been pulled to ground the column transistors 74 and 80 are turned on to connect the bit lines 30 and 38 to the input/output lines 76 and 82 respectively. The voltage states on the bit lines are transferred through the input/output lines to the input/output circuit 84 which has a sense amplifier therein to detect the voltage differential between the input/output lines 76 and 82. The sense amplifier in the input/output circuit determines the voltage state which is stored in the memory cell and transfers this voltage state through the data output line 87.

After one of the bit lines has been pulled to ground and the other bit line has been pulled to the supply voltage, the data state in the memory cell has been restored, and the row line 18 is returned to ground to isolate the charge on the storage capacitor. The bit lines are then permitted to float. The equilibration signal 56 is then applied to the gate terminals of transistors 50 and 52 to render these transistors conductive and connect bit line 30 to bit line 38 through latch node 46. This connection permits the charge on the bit lines to be shared such that the bit lines equilibrate to a voltage approximately midway between the supply voltage and ground. This is indicated in both of the waveforms 96 and 98 where the waveforms are returned to the equilibration voltage of two volts.

A representative circuit for the sense amplifier 44 shown in FIG. 1 is illustrated in FIG. 3. A pass transistor 104 has the source and drain terminals thereof connected between bit line 30 and a node 106. A second pass transistor 108 has a source and drain terminals thereof connected between bit line 38 and a node 110. The gate terminals of both transistors 104 and 108 are connected to a high voltage, such as the supply voltage $V_{cc}$. Transistors 104 and 108 are always conductive and function as resistors. A transistor 112 has the drain terminal thereof connected to node 106 and the source terminal thereof connected to the latch node 46. The gate terminal of transistor 112 is connected to node 110. A transistor 114 has the drain terminal thereof connected to node 110, the source terminal thereof connected to node 46 and the gate terminal thereof connected to node 106.

The sense amplifier operation occurs after a memory cell has been connected to one of the bit lines, either 30 or 38. One of the bit lines is then at a higher voltage than the other bit line. Assume, for example, that bit line 30 is at the higher voltage. When the latch signal slowly pulls node 46 to ground, transistor 114 will be turned on before transistor 112 because the gate to source bias on transistor 114 is greater than the gate to source bias on transistor 112. As transistor 114 is rendered conductive node 110 will be discharged through transistor 114 into the latch node 46. As node 110 is discharged the gate bias on transistor 112 is lowered thus preventing transistor 112 from being rendered conductive. When the latch signal is pulled all the way to ground transistor 114 will continue to be conductive since bit line 30 and node 106 remain at the previous high charge state. As node 110 is discharged, conduction through transistor 108 discharges bit line 38. Thus, after the latch signal has gone completely to ground bit line 38 will also be pulled to ground.

If bit line 38 is at a higher voltage after a memory cell is connected to one of the bit lines, transistor 112 will be rendered conductive to discharge node 106 and pull bit line 30 to ground.

A schematic illustration for the pull-up circuits 60 and 68 is given in FIG. 4. A transistor 120 has the drain terminal thereof connected to $V_{cc}$, the source terminal thereof connected to a node 122 and the gate terminal thereof connected to receive the precharge signal P. A transistor 124 has the drain terminal thereof connected to node 122, the source terminal thereof connected to bit line 30 and the gate terminal thereof connected to receive the precharge signal $P_0$.

A transistor 126 has the drain terminal thereof connected to receive the precharge signal $P_1$, the gate terminal thereof connected to node 122 and the source terminal thereof connected to the gate terminal of a transistor 128. The drain terminal of transistor 128 is connected to the $V_{cc}$ and the source terminal thereof is connected to bit line 30.

When the precharge signal P is received transistor 120 is rendered conductive to precharge node 122 to a high voltage state. Once the precharge signal returns to a low voltage level the node 122 is left floating at the high voltage state. When the precharge signal $P_0$ goes to approximately 2 volts, transistor 124 is rendered conductive if the bit line 30 is at a sufficiently low voltage state such that there is at least one transistor threshold voltage between the gate and source terminals of transistor 124. If transistor 124 is rendered conductive node 122 is discharged into the bit line 30.

But if the charge on bit line 30 is sufficiently high so that there is less than one transistor threshold voltage between the gate and source terminals of transistor 124, transistor 124 will not be rendered conductive by the precharge signal $P_0$, leaving node 122 floating at a high voltage level. The $P_1$ signal is then applied to the drain terminal of transistor 126. If node 122 is at a high voltage, transistor 126 is conductive so that the source of transistor 126 follows signal $P_1$ above $V_{cc}$. This is possible since the channel capacitance of transistor 126 bootstraps node 122 to a high voltage level. With the full voltage level of bootstrapped precharge signal $P_1$ applied to the gate terminal of transistor 128, the full supply voltage $V_{cc}$ is applied to the bit line 30, thereby pulling the bit line to the voltage state of $V_{cc}$. Thus when the voltage on the bit line 30 is above a preset level, the bit line will be elevated to the supply voltage by operation of the precharge circuit 60, but if the voltage on the bit line 30 is less than a preset level, the precharge circuit 60 will have no effect upon the bit line 30.

In summary, the present invention comprises a dynamic random access memory in which bit lines are equilibrated to approximately one half of the supply voltage before a memory cell is connected thereto. A sense amplifier detects the voltage difference on the bit lines caused by the connection of the storage capacitor to one of the bit lines and pulls the bit line having a lower voltage thereon to ground. A pull up circuit elevates the bit line having the greater voltage thereon. After the voltage state is transferred through input/output lines and after the memory cell is isolated, the bit lines are permitted to float and are connected together through a latch node so that the bit lines are returned to the equilibration voltage as a result of charge transfer between the bit lines.

Although one embodiment of the invention has been illustrated in the accompanying drawings and described in the foregoing Detailed Description, it will be understood that the invention is not limited to the embodiment disclosed, but is capable of numerous rearrangements, modifications and substitutions without departing from the scope of the invention.

I claim:

1. The method of operation for a dynamic random access memory, comprising the steps of:

storing a first voltage state or a second voltage state in a dynamic memory cell where said first voltage state corresponds to a first data state and said second voltage state corresponds to a second data state;

connecting said memory cell to one of a pair of bit lines, after said bit lines have been set to a third voltage state, to drive the bit line connected thereto to a fourth voltage state when said memory cell has had said first voltage state stored therein or to drive said bit line connected thereto to a fifth voltage state when said memory cell has had said second voltage state stored therein while the other bit line of said pair of bit lines substantially maintains said third voltage state thereon;

driving the one of said bit lines having the lower voltage thereon to a low voltage state after said memory cell has been connected to one of said bit lines;

driving the other of said bit lines to a high voltage state after said memory cell has been connected to one of said bit lines;

disconnecting said memory cell from the corresponding bit line after the corresponding bit line has been driven to either said low voltage state or to said high voltage state, and connecting together said bit lines of said pair after one of said bit lines has been driven to said low voltage state and the other of said bit lines has been driven to said high voltage state to equilibrate the voltages on said bit lines to said third voltage state where said third voltage state is between said first voltage state and said second voltage state, and said third voltage state is also between said fourth voltage state and said fifth voltage state.

2. The method recited in claim 1 including the step of floating each of said bit lines after one of said bit lines has been driven to said low voltage state and the other of said bit lines has been driven to said high voltage state.

3. The method recited in claim 2 wherein the step of connecting together said bit lines comprises connecting each of said bit lines to a common node.

4. The method recited in claim 1 wherein the step of connecting together said bit lines comprises sharing charge between said bit line such that said bit lines are equilibrated to said third voltage state and said third voltage state is approximately midway between said high voltage state and said low voltage state.

5. The method recited in claim 1 wherein the step of driving the one of said bit lines having the lowest voltage thereon to a low voltage state occurs before the step of driving the other of said bit lines to a high voltage state.

6. A dynamic random access memory comprising:
at least one pair of bit lines,
at least one dynamic memory cell for each of said bit lines wherein each memory cell has stored therein either a first voltage state which corresponds to a first data state or a second voltage which corresponds to a second data state,
means for connecting one of said memory cells to the corresponding bit line in response to a memory address supplied to said memory and said bit lines have been floating at a third voltage state wherein the bit line connected to the memory cell is driven to a fourth voltage state if said memory cell connected thereto had said first voltage stored therein or said bit line is driven to a fifth voltage state if said memory cell connected thereto had said second voltage state stored therein,
a sense amplifier connected to each of said bit line pairs for driving to a low voltage state the one of the bit lines connected thereto which has the lower voltage thereon when said sense amplifier receives a latch signal,
a pull-up circuit for each of said bit lines for pulling the bit line connected thereto to a high voltage state after the other bit line of the pair has been driven to said low voltage state,
means for disconnecting said memory cell from said bit line after the bit line previously connected thereto has been driven to either said low voltage state or said high voltage state, and
means for connecting together the bit lines of said pair after one of said bit lines has been driven to said low voltage state and the other of said bit lines has been driven to said high voltage state to equilibrate the voltages on said bit lines at said third voltage state wherein said third voltage state is between said first voltage state and said second voltage state and said third voltage state is also between said fourth voltage state and said fifth voltage state.

7. The dynamic random access memory recited in claim 6 including means for isolating each of said bit lines after one of said bit lines has been driven to said low voltage state and the other of said bit lines has been driven to said high voltage state.

8. The dynamic random access memory recited in claim 6 wherein said means for connecting together the bit lines comprises a first transistor having the drain and source terminals thereof connected between one of said bit lines of said pair and a latch node of said sense amplifier and a second transistor having the drain and source terminals thereof connected between the other bit line of said pair and said latch node, the gate terminals of said transistors connected to receive an equilibrate signal which renders said transistors conductive and equilibrates the voltage on said bit lines to said third voltage by charge transfer between said bit lines.

9. The dynamic random access memory recited in claim 6 wherein each of said memory cells comprises an access transistor having the drain terminal thereof connected to one of said bit lines, and the gate terminal thereof connected to a row line and the source terminal thereof connected to a first terminal of a storage capacitor having a second terminal thereof connected to a common node.

* * * * *